US007988075B2

(12) United States Patent
Altenburger

(10) Patent No.: US 7,988,075 B2
(45) **Date of Patent: *Aug. 2, 2011**

(54) CIRCUIT BOARD CONFIGURATION FOR AIR-POWERED ELECTROSTATICALLY AIDED COATING MATERIAL ATOMIZER

(75) Inventor: Gene P. Altenburger, Maumee, OH (US)

(73) Assignee: Illinois Tool Works Inc., Glenview, IL (US)

( * ) Notice: Subject to any disclaimer, the term of this patent is extended or adjusted under 35 U.S.C. 154(b) by 599 days.

This patent is subject to a terminal disclaimer.

(21) Appl. No.: 12/045,175

(22) Filed: Mar. 10, 2008

(65) Prior Publication Data

US 2009/0224076 A1 Sep. 10, 2009

(51) Int. Cl.
*B05B 7/02* (2006.01)

(52) U.S. Cl. ........ 239/526; 239/692; 239/525; 239/704; 239/706; 239/708

(58) Field of Classification Search .................. 239/525, 239/526, 698, 699, 690, 692, 704, 706, 707, 239/708

See application file for complete search history.

(56) References Cited

U.S. PATENT DOCUMENTS 2,057,434 A 10/1936 Jaden et al.
3,169,882 A 2/1965 Juvinall et al.
3,169,883 A 2/1965 Juvinall
3,557,821 A 1/1971 Siegel et al.
3,653,592 A 4/1972 Cowan
3,932,071 A 1/1976 Schaedler
3,940,061 A 2/1976 Gimple et al.
3,949,266 A 4/1976 Vogts et al.
3,964,683 A 6/1976 Gimple
3,990,609 A 11/1976 Grant
4,001,935 A 1/1977 Krohn et al.
4,002,777 A 1/1977 Juvinall et al.
4,020,393 A 4/1977 Porter
4,030,857 A 6/1977 Smith, Jr.

(Continued)

FOREIGN PATENT DOCUMENTS

EP 0 734 777 A2 10/1996

(Continued)

OTHER PUBLICATIONS

Official action from U.S. Appl. No. 12/045,356 dated Aug. 13, 2009.

(Continued)

*Primary Examiner* — Len Tran
*Assistant Examiner* — Trevor E McGraw
(74) *Attorney, Agent, or Firm* — Barnes & Thornburg LLP

(57) ABSTRACT

A coating dispensing device includes a trigger assembly for actuating the coating dispensing device to dispense coating material and a nozzle through which the coating material is dispensed. The coating dispensing device also includes a first port adapted to supply compressed gas to the coating dispensing device and a second port adapted to supply coating material to the coating dispensing device. The coating dispensing device further includes a generator having a shaft and a turbine wheel mounted on the shaft. Compressed gas coupled to the first port impinges upon the turbine wheel to spin the shaft, producing voltage. The dispensing device further includes an electrode adjacent the nozzle and coupled by circuitry to the generator to receive electricity therefrom to electrostatically charge the coating material. A circuit board assembly containing components of the circuitry is configured to partially surround and partially enclose the generator.

28 Claims, 7 Drawing Sheets

U.S. PATENT DOCUMENTS

| | | | | | |
|---|---|---|---|---|---|
| 4,037,561 | A | | 7/1977 | LaFave et al. | |
| 4,066,041 | A | | 1/1978 | Buschor et al. | |
| 4,081,904 | A | | 4/1978 | Krohn et al. | |
| 4,105,164 | A | | 8/1978 | Lau et al. | |
| 4,116,364 | A | | 9/1978 | Culbertson et al. | |
| 4,122,327 | A | | 10/1978 | Vogts et al. | |
| 4,133,483 | A | | 1/1979 | Henderson | |
| 4,144,564 | A | | 3/1979 | Lamb | |
| D252,097 | S | | 6/1979 | Probst et al. | |
| 4,165,022 | A | | 8/1979 | Bentley et al. | |
| 4,169,545 | A | | 10/1979 | Decker | |
| 4,171,100 | A | | 10/1979 | Benedek et al. | |
| 4,174,070 | A | | 11/1979 | Lau et al. | |
| 4,174,071 | A | | 11/1979 | Lau et al. | |
| 4,214,709 | A | | 7/1980 | Scull et al. | |
| 4,216,915 | A | | 8/1980 | Hengartner et al. | |
| 4,219,865 | A | | 8/1980 | Malcolm | |
| 4,248,386 | A | | 2/1981 | Morle | |
| 4,266,721 | A | | 5/1981 | Sickles | |
| 4,285,446 | A | | 8/1981 | Rapp et al. | |
| 4,289,278 | A | | 9/1981 | Itoh | |
| 4,290,091 | A | | 9/1981 | Malcolm | |
| 4,331,298 | A | | 5/1982 | Bentley et al. | |
| RE030,968 | E | | 6/1982 | Grant | |
| 4,361,283 | A | | 11/1982 | Hetherington et al. | |
| 4,377,838 | A | | 3/1983 | Levey et al. | |
| D270,179 | S | | 8/1983 | Grime | |
| D270,180 | S | | 8/1983 | Grime | |
| D270,367 | S | | 8/1983 | Grime | |
| D270,368 | S | | 8/1983 | Grime | |
| 4,401,268 | A | | 8/1983 | Pomponi, Jr. | |
| 4,433,812 | A | | 2/1984 | Grime | |
| 4,437,614 | A | | 3/1984 | Garcowski | |
| 4,453,670 | A | | 6/1984 | Sirovy | |
| 4,462,061 | A | | 7/1984 | Mommsen | |
| 4,483,483 | A | | 11/1984 | Grime | |
| 4,491,276 | A | | 1/1985 | Reeves | |
| 4,513,913 | A | | 4/1985 | Smith | |
| 4,529,131 | A | | 7/1985 | Rutz | |
| 4,537,357 | A | | 8/1985 | Culbertson et al. | |
| 4,567,911 | A | | 2/1986 | Kedem | |
| 4,572,438 | A | | 2/1986 | Traylor | |
| 4,606,501 | A | | 8/1986 | Bate et al. | |
| 4,613,082 | A | | 9/1986 | Gimple et al. | |
| D287,266 | S | | 12/1986 | Knetl et al. | |
| 4,679,734 | A | * | 7/1987 | Mommsen et al. | 239/692 |
| 4,702,420 | A | | 10/1987 | Rath | |
| 4,747,546 | A | | 5/1988 | Talacko | |
| 4,752,034 | A | | 6/1988 | Kuhn et al. | |
| 4,759,502 | A | | 7/1988 | Pomponi, Jr. et al. | |
| 4,760,962 | A | | 8/1988 | Wheeler | |
| 4,770,117 | A | | 9/1988 | Hetherington et al. | |
| 4,819,879 | A | | 4/1989 | Sharpless et al. | |
| 4,828,218 | A | | 5/1989 | Medlock | |
| 4,844,342 | A | | 7/1989 | Foley | |
| D303,139 | S | | 8/1989 | Morgan | |
| D305,057 | S | | 12/1989 | Morgan | |
| 4,890,190 | A | | 12/1989 | Hemming | |
| D305,452 | S | | 1/1990 | Morgan | |
| D305,453 | S | | 1/1990 | Morgan | |
| 4,911,367 | A | | 3/1990 | Lasley | |
| 4,921,172 | A | | 5/1990 | Beimain et al. | |
| 4,927,079 | A | | 5/1990 | Smith | |
| 4,934,603 | A | | 6/1990 | Lasley | |
| 4,934,607 | A | | 6/1990 | Lasley | |
| D313,064 | S | | 12/1990 | Lind et al. | |
| 4,978,075 | A | * | 12/1990 | Lind et al. | 239/690 |
| 4,993,645 | A | | 2/1991 | Buschor | |
| 5,022,590 | A | | 6/1991 | Buschor | |
| D318,712 | S | | 7/1991 | Buschor | |
| 5,039,019 | A | | 8/1991 | Weinstein et al. | |
| 5,054,687 | A | | 10/1991 | Burns et al. | |
| 5,056,720 | A | * | 10/1991 | Crum et al. | 239/698 |
| 5,063,350 | A | | 11/1991 | Hemming et al. | |
| 5,064,119 | A | | 11/1991 | Mellette | |
| 5,073,709 | A | | 12/1991 | Lunzer et al. | |
| 5,074,466 | A | | 12/1991 | Santiago | |
| 5,080,289 | A | | 1/1992 | Lunzer | |
| 5,090,623 | A | | 2/1992 | Burns et al. | |
| 5,093,625 | A | | 3/1992 | Lunzer | |
| D325,241 | S | | 4/1992 | Buschor | |
| 5,118,080 | A | | 6/1992 | Hartmann | |
| 5,119,992 | A | | 6/1992 | Grime | |
| 5,178,330 | A | | 1/1993 | Rodgers | |
| 5,180,104 | A | | 1/1993 | Mellette | |
| 5,209,365 | A | | 5/1993 | Wood | |
| 5,209,405 | A | | 5/1993 | Robinson et al. | |
| 5,209,740 | A | | 5/1993 | Bryant et al. | |
| 5,218,305 | A | * | 6/1993 | Lunzer | 324/457 |
| 5,235,228 | A | | 8/1993 | Nakanura et al. | |
| 5,236,129 | A | | 8/1993 | Grime et al. | |
| 5,236,425 | A | | 8/1993 | Kurtz et al. | |
| 5,284,299 | A | | 2/1994 | Medlock | |
| 5,284,301 | A | | 2/1994 | Kieffer | |
| 5,289,974 | A | | 3/1994 | Grime et al. | |
| 5,289,977 | A | | 3/1994 | Lind et al. | |
| 5,299,740 | A | | 4/1994 | Bert | |
| 5,303,865 | A | | 4/1994 | Bert | |
| 5,330,108 | A | | 7/1994 | Grime et al. | |
| 5,332,156 | A | | 7/1994 | Wheeler | |
| 5,332,159 | A | | 7/1994 | Grime et al. | |
| D349,387 | S | | 8/1994 | Crabbe | |
| D349,559 | S | | 8/1994 | Vanderhoef et al. | |
| 5,334,876 | A | * | 8/1994 | Washeleski et al. | 307/10.1 |
| D350,387 | S | | 9/1994 | Feitel et al. | |
| 5,351,887 | A | | 10/1994 | Heterington et al. | |
| 5,395,054 | A | | 3/1995 | Wheeler | |
| 5,400,971 | A | | 3/1995 | Maugans et al. | |
| 5,402,940 | A | | 4/1995 | Haller et al. | |
| 5,553,788 | A | | 9/1996 | Del Gaone et al. | |
| 5,582,350 | A | | 12/1996 | Kosmyna et al. | |
| 5,618,001 | A | | 4/1997 | Del Gaone et al. | |
| 5,639,027 | A | | 6/1997 | Fritz | |
| 5,644,461 | A | * | 7/1997 | Miller et al. | 361/56 |
| 5,647,543 | A | | 7/1997 | Ma | |
| RE035,769 | E | | 4/1998 | Grime et al. | |
| 5,759,271 | A | | 6/1998 | Buschor | |
| 5,803,313 | A | | 9/1998 | Flatt et al. | |
| 5,829,679 | A | | 11/1998 | Strong | |
| 5,836,517 | A | | 11/1998 | Burns et al. | |
| 5,957,395 | A | | 9/1999 | Howe et al. | |
| RE036,378 | E | | 11/1999 | Mellette | |
| 6,179,223 | B1 | * | 1/2001 | Sherman et al. | 239/124 |
| 6,189,809 | B1 | | 2/2001 | Schwebemeyer | |
| 6,276,616 | B1 | | 8/2001 | Jenkins | |
| 6,402,058 | B2 | | 6/2002 | Kaneko et al. | |
| 6,417,595 | B1 | | 7/2002 | Wasson | |
| 6,425,761 | B1 | | 7/2002 | Eibofner | |
| 6,460,787 | B1 | | 10/2002 | Hartle et al. | |
| 6,488,264 | B2 | | 12/2002 | Wiklund | |
| 6,522,039 | B1 | | 2/2003 | Baltz et al. | |
| 6,572,029 | B1 | | 6/2003 | Holt | |
| 6,622,948 | B1 | | 9/2003 | Haas et al. | |
| 6,669,112 | B2 | | 12/2003 | Reetz, III et al. | |
| 6,679,193 | B2 | | 1/2004 | Shutic et al. | |
| 6,698,670 | B1 | | 3/2004 | Gosis et al. | |
| 6,712,292 | B1 | | 3/2004 | Gosis et al. | |
| RE38,526 | E | | 6/2004 | Hansinger et al. | |
| 6,758,425 | B2 | | 7/2004 | Michael | |
| 6,776,362 | B2 | | 8/2004 | Kawamoto et al. | |
| 6,790,285 | B2 | | 9/2004 | Matsumoto | |
| 6,796,519 | B1 | | 9/2004 | Knobbe et al. | |
| 6,817,553 | B2 | | 11/2004 | Steur | |
| 6,854,672 | B2 | | 2/2005 | Allen | |
| 6,877,681 | B2 | | 4/2005 | Hartle et al. | |
| 6,916,023 | B2 | | 7/2005 | Alexander et al. | |
| 6,929,698 | B2 | | 8/2005 | Shutic et al. | |
| 6,951,309 | B2 | | 10/2005 | Buschor et al. | |
| 6,955,724 | B2 | | 10/2005 | Dankert | |
| 6,975,050 | B2 | | 12/2005 | Cleanthous et al. | |
| 7,058,291 | B2 | * | 6/2006 | Weaver et al. | 318/720 |
| 7,128,277 | B2 | | 10/2006 | Schaupp | |
| 7,143,963 | B2 | | 12/2006 | Tani et al. | |
| 7,166,164 | B2 | | 1/2007 | Shutic et al. | |
| 7,217,442 | B2 | | 5/2007 | Wilt et al. | |
| 7,247,205 | B2 | | 7/2007 | Shutic et al. | |
| 7,292,322 | B2 | | 11/2007 | Boroditsky et al. | |

| | | | | |
|---|---|---|---|---|
| 7,296,759 | B2 | 11/2007 | Alexander et al. | |
| 7,296,760 | B2 | 11/2007 | Alexander et al. | |
| 7,621,471 | B2 | 11/2009 | Howe | |
| 7,757,973 | B2 | 7/2010 | Alexander et al. | |
| 7,926,748 | B2 * | 4/2011 | Altenburger | 239/692 |
| 2003/0006322 | A1 | 1/2003 | Hartle et al. | |
| 2003/0151320 | A1 | 8/2003 | Poon et al. | |
| 2004/0195405 | A1 * | 10/2004 | Healy | 239/690 |
| 2006/0081729 | A1 * | 4/2006 | Nagai | 239/690.1 |
| 2006/0219824 | A1 * | 10/2006 | Alexander et al. | 239/690 |
| 2006/0283386 | A1 | 12/2006 | Alexander et al. | |
| 2008/0286458 | A1 | 11/2008 | Kirchoff | |
| 2009/0058209 | A1 | 3/2009 | Baranowski et al. | |
| 2009/0223446 | A1 * | 9/2009 | Baltz | 118/629 |
| 2009/0224075 | A1 * | 9/2009 | Altenburger | 239/526 |
| 2009/0224077 | A1 * | 9/2009 | Altenburger | 239/526 |
| 2009/0224083 | A1 * | 9/2009 | Baltz | 239/692 |

FOREIGN PATENT DOCUMENTS

| | | | |
|---|---|---|---|
| GB | 2 053 029 | A1 | 2/1981 |
| GB | 1 597 349 | | 9/1981 |
| GB | 2 153 260 | A | 8/1985 |
| KR | 10-0807151 | B1 | 4/2008 |
| WO | 01/85353 | A1 | 11/2001 |
| WO | 2005/014177 | A1 | 2/2005 |
| WO | 2006/107935 | A1 | 10/2006 |
| WO | 2008/039016 | A1 | 4/2008 |

OTHER PUBLICATIONS

Official action from U.S. Appl. No. 12/045,155 dated Aug. 13, 2009.
R-E-A 70 Hand Gun Interim Service Manual, Model 72074, Ransburg Electrostatic Equipment, Incorporated, Feb. 1985, 3 pages.
R-E-A 70 Electrostatic Paint Finishing System from Ransburg Electrostatic Equipment, Inc., Factory Mutual Research Corporation, May 19, 1986, 3 pages.
The R-E-A-70 Electrostatic Handgun brochure, Ransburg Gema, date unknown, 6 pages.
Official action from U.S. 12/045,155 dated Jan. 29, 2010.
Official action from U.S. 12/045,155 dated May 11, 2010.
Official action from U.S. 12/045,354 dated Feb. 25, 2010.
Official action from U.S. 12/045,173 dated Mar. 19, 2010.
Official action from U.S. 12/045,169 dated Apr. 14, 2010.
Official action from U.S. 12/045,178 dated May 13, 2010.
"REA-IV and REA-IVL Delta Electrostatic Spray Guns, Dual Atomization Technology", Service Manual, ITW Ransburg Electrostatic Systems, 1998, 27 pages, Addendum, 2005, 4 pages.
"Automatic R-E-A III Electrostatic Spray or R-E-A III-L Electrostatic HVLP Spray", ITW Ransburg Electrostatic Systems, 1996, 2 pages.
"Automatic R-E-M Air-Assisted Airless Electrostatic Spray Gun", ITW Ransburg Electrostatic Systems, 1995, 2 pages.
REA-90A and REA-90LA Automatic Electrostatic Spray Guns, Service Manual, ITW Ransburg, 2006, 44 pages.
"M90 Handguns", Service Manual, Ransburg, 2005, 48 pages.
"REA-70 and REA-70L Electrostastic Spray Guns Dual Atomization Technology", Service Manual, Ransburg, 41 pages.
International search report from PCT/US2209/035242 dated May 19, 2009, 14 pages.
Written opinion from PCT/US2009/035411 dated Jun. 9, 2009, 10 pages.
International search report and written opinion from PCT/US2009/035439, dated Jun. 5, 2009, 12 pages.
International search report and written opinion from PCT/US2009/035720, dated Jun. 3, 2009, 12 pages.
International search report and written opinion from PCT/US2009/035485, dated Jun. 10, 2009, 12 pages.

* cited by examiner

CIRCUIT BOARD CONFIGURATION FOR AIR-POWERED ELECTROSTATICALLY AIDED COATING MATERIAL ATOMIZER

CROSS-REFERENCE TO RELATED APPLICATIONS

This application is related to U.S. Ser. No. 12/045,155, titled Sealed Electrical Source For Air-Powered Electrostatic Atomizing And Dispensing Device, U.S. Ser. No. 12/045,173, titled Controlling Temperature In Air-Powered Electrostatically Aided Coating Material Atomizer, U.S. Ser. No. 12/045,169, titled Circuit For Displaying The Relative Voltage At The Output Electrode Of An Electrostatically Aided Coating Material Atomizer, U.S. Ser. No. 12/045,178, titled Generator For Air-Powered Electrostatically Aided Coating Dispensing Device, and U.S. Ser. No. 12/045,354, titled Method And Apparatus For Retaining Highly Torqued Fittings In Molded Resin Or Polymer Housing, all filed on the same day as this application, the disclosures of all of which are hereby incorporated herein by reference.

FIELD OF THE INVENTION

This invention relates to electrostatically aided coating material atomization and dispensing devices, hereinafter sometimes called spray guns or guns. Without limiting the scope of the invention, it is disclosed in the context of a spray gun powered by compressed gas, typically compressed air. Hereinafter, such guns are sometimes called cordless spray guns or cordless guns.

BACKGROUND

Various types of manual and automatic spray guns are known. There are the cordless electrostatic handguns illustrated and described in U.S. Pat. Nos. 4,219,865; 4,290,091; 4,377,838; and, 4,491,276. There are also, for example, the automatic and manual spray guns illustrated and described in the following listed U.S. patents and published applications: 2006/0283386; 2006/0219824; 2006/0081729; 2004/0195405; 2003/0006322; U.S. Pat. Nos. 7,296,760; 7,296,759; 7,292,322; 7,247,205; 7,217,442; 7,166,164; 7,143,963; 7,128,277; 6,955,724; 6,951,309; 6,929,698; 6,916,023; 6,877,681; 6,854,672; 6,817,553; 6,796,519; 6,790,285; 6,776,362; 6,758,425; RE38,526; 6,712,292; 6,698,670; 6,679,193; 6,669,112; 6,572,029; 6,488,264; 6,460,787; 6,402,058; RE36,378; 6,276,616; 6,189,809; 6,179,223; 5,836,517; 5,829,679; 5,803,313; RE35,769; 5,647,543; 5,639,027; 5,618,001; 5,582,350; 5,553,788; 5,400,971; 5,395,054; D350,387; D349,559; 5,351,887; 5,332,159; 5,332,156; 5,330,108; 5,303,865; 5,299,740; 5,289,977; 5,289,974; 5,284,301; 5,284,299; 5,236,425; 5,236,129; 5,218,305; 5,209,405; 5,209,365; 5,178,330; 5,119,992; 5,118,080; 5,180,104; D325,241; 5,093,625; 5,090,623; 5,080,289; 5,074,466; 5,073,709; 5,064,119; 5,063,350; 5,054,687; 5,039,019; D318,712; 5,022,590; 4,993,645; 4,978,075; 4,934,607; 4,934,603; D313,064; 4,927,079; 4,921,172; 4,911,367; D305,453; D305,452; D305,057; D303,139; 4,890,190; 4,844,342; 4,828,218; 4,819,879; 4,770,117; 4,760,962; 4,759,502; 4,747,546; 4,702,420; 4,613,082; 4,606,501; 4,572,438; 4,567,911; D287,266; 4,537,357; 4,529,131; 4,513,913; 4,483,483; 4,453,670; 4,437,614; 4,433,812; 4,401,268; 4,361,283; D270,368; D270,367; D270,180; D270,179; RE30,968; 4,331,298; 4,289,278; 4,285,446; 4,266,721; 4,248,386; 4,216,915; 4,214,709; 4,174,071; 4,174,070; 4,171,100; 4,169,545; 4,165,022; D252,097; 4,133,483; 4,122,327; 4,116,364; 4,114,564; 4,105,164; 4,081,904; 4,066,041; 4,037,561; 4,030,857; 4,020,393; 4,002,777; 4,001,935; 3,990,609; 3,964,683; 3,949,266; 3,940,061; 3,932,071; 3,557,821; 3,169,883; and, 3,169,882. There are also the disclosures of WO 2005/014177 and WO 01/85353. There are also the disclosures of EP 0 734 777 and GB 2 153 260. There are also the Ransburg model REA 3, REA 4, REA 70, REA 90, REM and M-90 guns, all available from ITW Ransburg, 320 Phillips Avenue, Toledo, Ohio, 43612-1493.

The disclosures of these references are hereby incorporated herein by reference. The above listing is not intended to be a representation that a complete search of all relevant art has been made, or that no more pertinent art than that listed exists, or that the listed art is material to patentability. Nor should any such representation be inferred.

DISCLOSURE OF THE INVENTION

According to an aspect of the invention, a coating dispensing device includes a trigger assembly for actuating the coating dispensing device to dispense coating material and a nozzle through which the coating material is dispensed. The coating dispensing device also includes a first port adapted to supply compressed gas to the coating dispensing device and a second port adapted to supply coating material to the coating dispensing device. The coating dispensing device further includes a generator having a shaft and a turbine wheel mounted on the shaft. Compressed gas coupled to the first port impinges upon the turbine wheel to spin the shaft, producing voltage. The dispensing device further includes an electrode adjacent the nozzle and coupled by circuitry to the generator to receive electricity therefrom to electrostatically charge the coating material. A circuit board assembly containing components of the circuitry is configured to partially surround and partially enclose the generator.

Illustratively according to this aspect of the invention, the circuit board assembly configured to partially surround and partially enclose the generator comprises a somewhat U-shaped board assembly comprising a central board having two opposed edge regions and a board extending from each of said two opposed edge regions of the central board.

Illustratively according to this aspect of the invention, the coating dispensing device further includes a regulator coupled to the generator for regulating the voltage generated by generator. At least some components of the regulator are provided on the somewhat U-shaped board assembly. Compressed gas which spins the turbine wheel also flows past the at least some components of the regulator provided on the somewhat U-shaped board assembly to remove heat from the at least some components of the regulator provided on the somewhat U-shaped board assembly.

Illustratively according to this aspect of the invention, the at least some components of the regulator include an over-voltage protection circuit.

Illustratively according to this aspect of the invention, the over-voltage protection circuit comprises a self-resetting over-voltage protection circuit.

Illustratively according to this aspect of the invention, the at least some components of the regulator include a limiting circuit for reducing the likelihood of the generator output running away in the event of excessive compressed gas flow to the turbine wheel.

Illustratively according to this aspect of the invention, compressed gas which spins the turbine wheel also flows past the limiting circuit. The limiting circuit includes a heat-dissipating device which dissipates more heat when excessive compressed gas flows to the turbine wheel, so that excessive compressed gas flow to the turbine wheel provides increased cooling capacity to the heat-dissipating device.

Illustratively according to this aspect of the invention, the at least some components of the regulator include a limiting circuit for reducing the likelihood of the generator running away when the generator experiences a light load.

Illustratively according to this aspect of the invention, the limiting circuit is sized to keep the generator from excessive speed when the generator experiences a light load.

Illustratively according to this aspect of the invention, the limiting circuit comprises n solid state devices, n>1. Each solid state device is capable of dissipating about 1/n of the total heat dissipated by the n solid state devices collectively.

Illustratively according to this aspect of the invention, the at least some components of the regulator include an output voltage adjusting circuit adapted to load the generator, causing the generator's speed to drop, thereby producing a lower generator output voltage.

Illustratively according to this aspect of the invention, the output voltage adjusting circuit includes a magnetically actuated switch controlling current flow through the output voltage adjusting circuit, and a magnet movable to actuate the magnetically actuated switch selectively to place the output voltage adjusting circuit in the regulator circuit and remove the output voltage adjusting circuit from the regulator circuit.

Illustratively according to this aspect of the invention, the output voltage adjusting circuit includes n resistors, n>1. Each resistor is capable of dissipating about 1/n of the total heat dissipated by the n resistors collectively.

Illustratively according to this aspect of the invention, the regulator includes an output terminal and a self-resetting fuse in series with the output terminal.

Illustratively according to this aspect of the invention, the regulator includes an output port and a transient suppressor diode across the output port to protect the output port against backward-propagating transients entering the regulator.

Illustratively according to this aspect of the invention, the regulator includes an output terminal coupled to the electrode and the at least some components of the regulator include a resistance in series with the output terminal.

Illustratively according to this aspect of the invention, the resistance in series with the output terminal includes n resistors, n>1. Each resistor is capable of dissipating about 1/n of the total heat dissipated by the n resistors collectively.

Illustratively according to this aspect of the invention, the coating dispensing device further includes a regulator coupled to the generator for regulating the voltage generated by generator. At least some components of the regulator are provided on the circuit board assembly. Compressed gas which spins the turbine wheel also flows past the at least some components of the regulator provided on the circuit board assembly to remove heat from the at least some components of the regulator provided on the circuit board assembly.

Illustratively according to this aspect of the invention, the at least some components of the regulator include an over-voltage protection circuit.

Illustratively according to this aspect of the invention, the over-voltage protection circuit comprises a self-resetting over-voltage protection circuit.

Illustratively according to this aspect of the invention, the at least some components of the regulator include a limiting circuit for reducing the likelihood of the generator output running away in the event of excessive compressed gas flow to the turbine wheel.

Illustratively according to this aspect of the invention, compressed gas which spins the turbine wheel also flows past the limiting circuit. The limiting circuit includes a heat-dissipating device which dissipates more heat when excessive compressed gas flows to the turbine wheel, so that excessive compressed gas flow to the turbine wheel provides increased cooling capacity to the heat-dissipating device.

Illustratively according to this aspect of the invention, the at least some components of the regulator include a limiting circuit for reducing the likelihood of the generator running away when the generator experiences a light load.

Illustratively according to this aspect of the invention, the limiting circuit is sized to keep the generator from excessive speed when the generator experiences a light load.

Illustratively according to this aspect of the invention, the limiting circuit comprises n solid state devices, n>1. Each solid state device is capable of dissipating about 1/n of the total heat dissipated by the n solid state devices collectively.

Illustratively according to this aspect of the invention, the at least some components of the regulator include an output voltage adjusting circuit adapted to load the generator, causing the generator's speed to drop, thereby producing a lower generator output voltage.

Illustratively according to this aspect of the invention, the output voltage adjusting circuit includes a magnetically actuated switch controlling current flow through the output voltage adjusting circuit, and a magnet movable to actuate the magnetically actuated switch selectively to place the output voltage adjusting circuit in the regulator circuit and remove the output voltage adjusting circuit from the regulator circuit.

Illustratively according to this aspect of the invention, the output voltage adjusting circuit includes n resistors, n>1. Each resistor is capable of dissipating about 1/n of the total heat dissipated by the n resistors collectively.

Illustratively according to this aspect of the invention, the regulator includes an output terminal and a self-resetting fuse in series with the output terminal.

Illustratively according to this aspect of the invention, the regulator includes an output port and a transient suppressor diode across the output port to protect the output port against backward-propagating transients entering the regulator.

Illustratively according to this aspect of the invention, the regulator includes an output terminal coupled to the electrode and the at least some components of the regulator include a resistance in series with the output terminal.

Illustratively according to this aspect of the invention, the resistance in series with the output terminal includes n resistors, n>1. Each resistor is capable of dissipating about 1/n of the total heat dissipated by the n resistors collectively.

BRIEF DESCRIPTION OF THE DRAWINGS

The invention may best be understood by referring to the following detailed description and accompanying drawings which illustrate the invention. In the drawings.

DETAILED DESCRIPTIONS OF ILLUSTRATIVE EMBODIMENTS

Figure 1A:
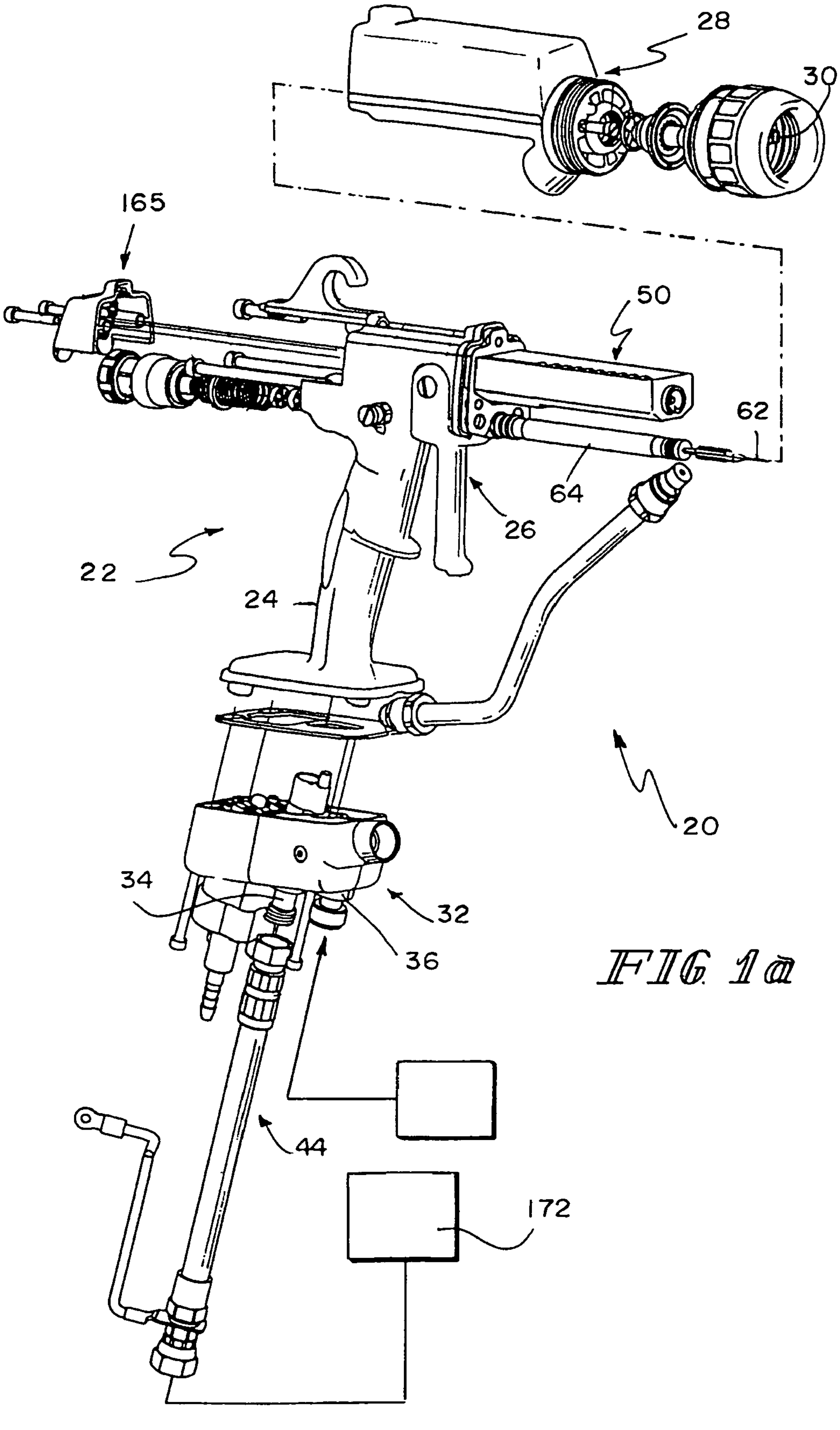
FIG. 1*a* illustrates a partly exploded perspective view of a hand-held cordless spray gun.
Figure 1B:
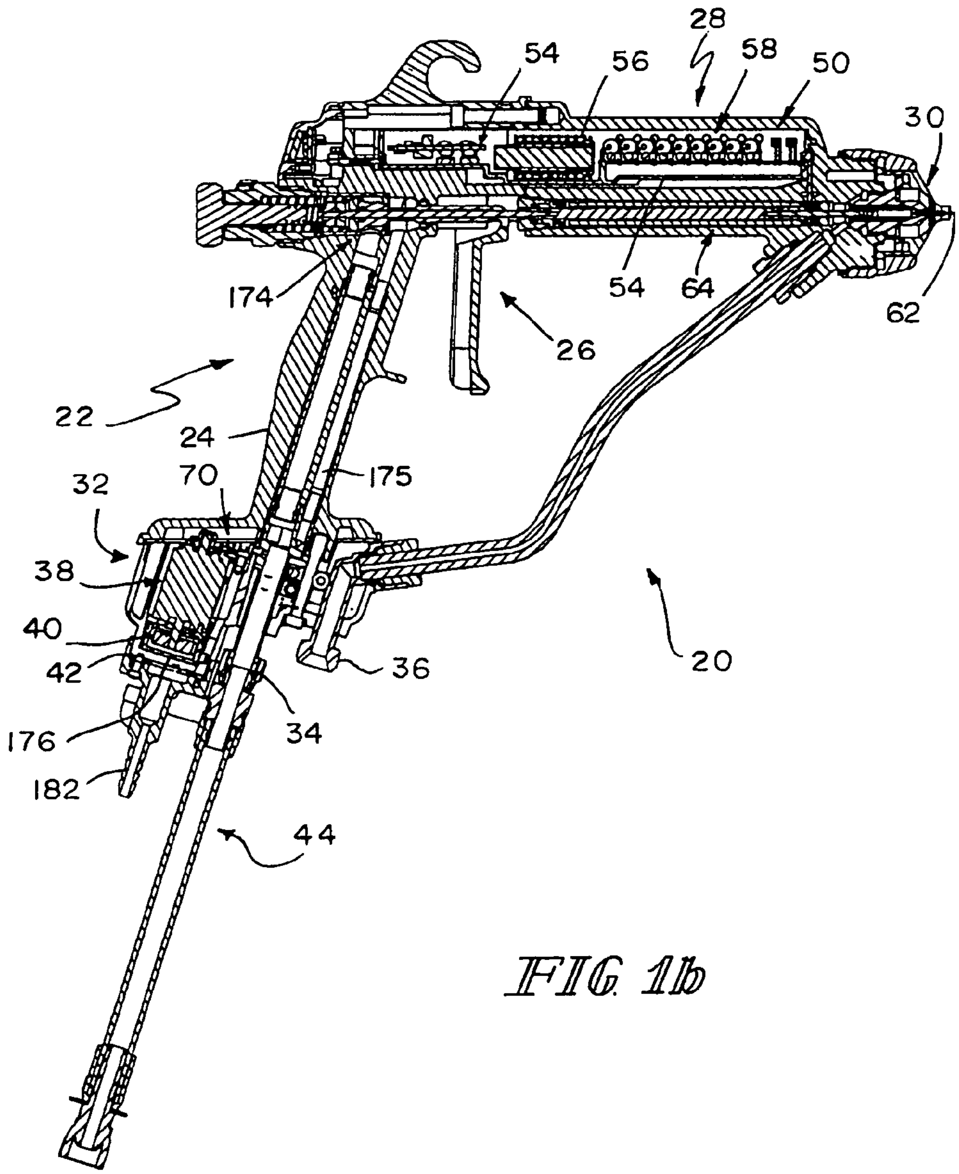
FIG. 1*b* illustrates a longitudinal sectional side elevational view of the hand-held cordless spray gun illustrated in FIG. 1*a;*
Figure 1C:
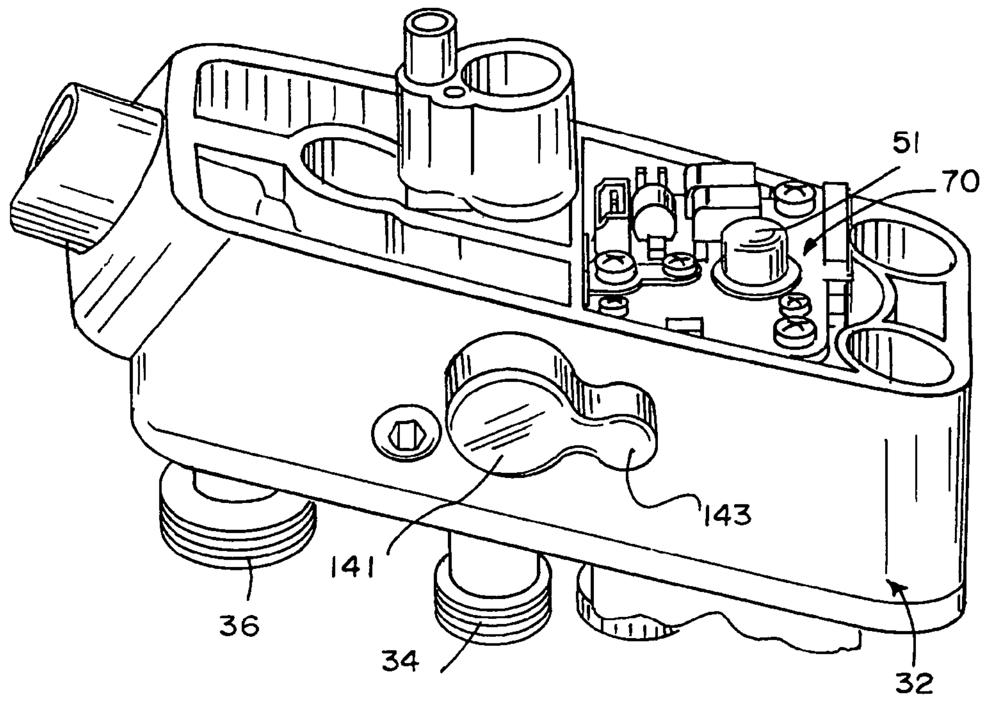
FIG. 1*c* illustrates a perspective view of certain details of the hand-held cordless spray gun illustrated in FIGS. 1*a-b;*
Figure 1D:
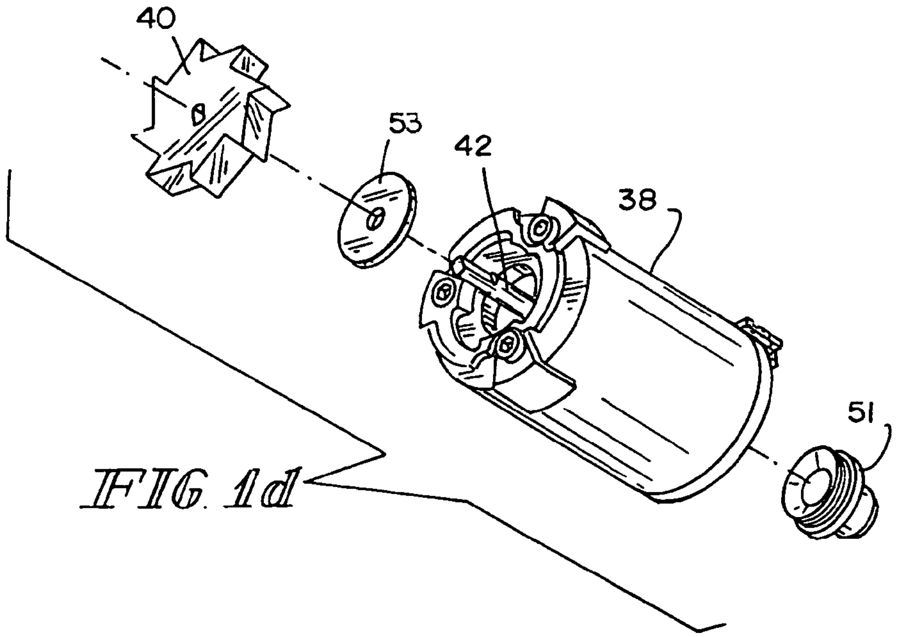
FIG. 1*d* illustrates a perspective view of certain details of the hand-held cordless spray gun illustrated in FIGS. 1*a-b;*
Figure 2C:
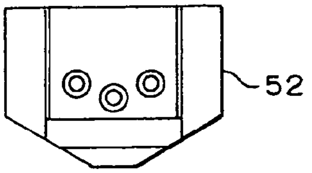
FIG. 2*c* illustrates an end elevational view of the high-magnitude voltage cascade assembly illustrated in FIGS. 2*a-b*, taken generally along section lines 2*c*-2*c* of FIGS. 2*a-b;*
Figure 2D:
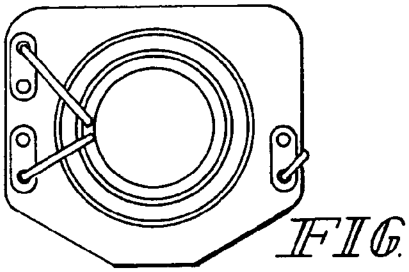
FIG. 2*d* illustrates a partial sectional view of the high-magnitude voltage cascade assembly illustrated in FIGS. 2*a-b*, taken generally along section lines 2*d*-2*d* of FIGS. 2*a-b;*
Figure 2A:
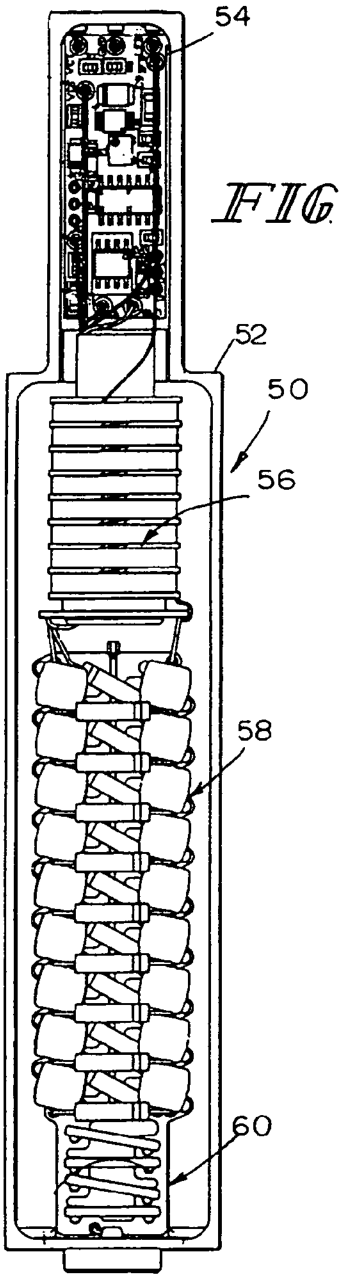
FIG. 2*a* illustrates a top plan view of a high-magnitude voltage cascade assembly useful in the described spray gun.
Figure 2B:
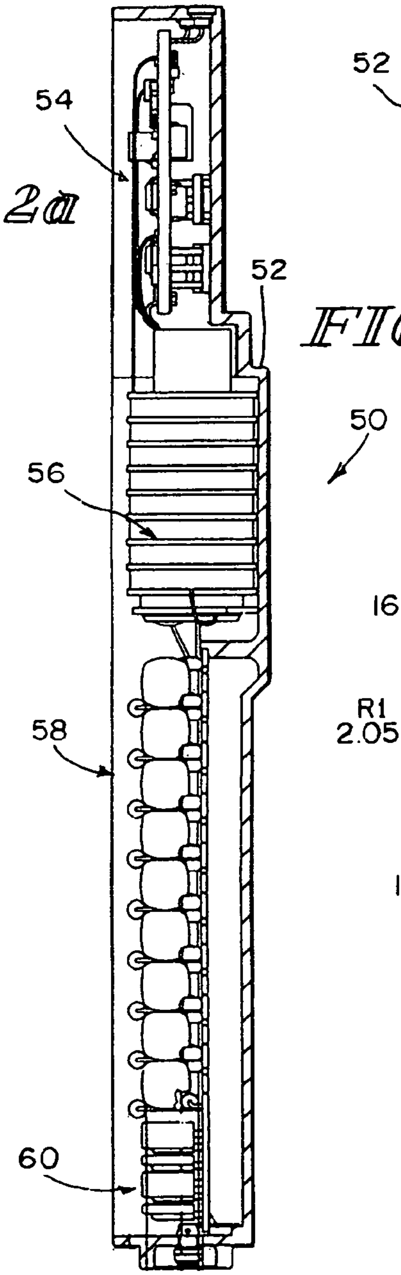
FIG. 2*b* illustrates a partial sectional view of a high-magnitude voltage cascade assembly useful in the described spray gun, taken generally along section lines 2*b*-2*b* of FIG. 2*a;*
Figure 2E:
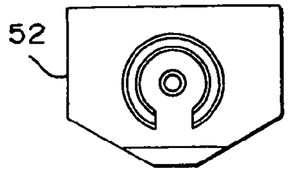
FIG. 2*e* illustrates an end elevational view of the high-magnitude voltage cascade assembly illustrated in FIGS. 2*a-b*, taken generally along section lines 2*e*-2*e* of FIGS. 2*a-b;*

As used herein, the term "generator" means a machine that converts mechanical energy into electrical energy, and encompasses devices for generating either direct or alternating electrical current.

The schematic and block circuit diagram descriptions that follow identify specific integrated circuits and other components and in many cases specific sources for these. Specific terminal and pin names and numbers are generally given in connection with these for the purposes of completeness. It is to be understood that these terminal and pin identifiers are provided for these specifically identified components. It is to be understood that this does not constitute a representation, nor should any such representation be inferred, that the specific components, component values or sources are the only components available from the same or any other sources capable of performing the necessary functions. It is further to be understood that other suitable components available from the same or different sources may not use the same terminal/pin identifiers as those provided in this description.

Referring to FIGS. 1*a-d*, a hand-held cordless spray gun 20 includes a handle assembly 22 providing a somewhat pistol-grip shaped handle 24, a trigger assembly 26 for actuating the gun 20 to dispense electrostatically charged atomized coating material droplets, and a barrel assembly 28 supporting at its remote end a nozzle 30. At its lower end, handle assembly 22 supports a power module assembly 32 including fittings 34, 36 through which compressed gas, typically compressed air, and coating material, in this embodiment liquid paint, respectively, are supplied to gun 20. Power module 32 houses a three-phase generator 38 such as, for example, the Maxon EC-max part number 348702 available from Maxon Precision Motors, Inc., 101 Waldron Road, Fall River, Mass. 02720. A significant benefit available with the use of a multi-phase generator 38 is that the generator 38 can be operated at a lower rotation rate (in one example, significantly lower; 300 rpm versus the prior art's up to 42 Krpm). Generally, a lower rotation rate results in increased generator life, reduced repair cost and reduced equipment downtime.

Figure 4:
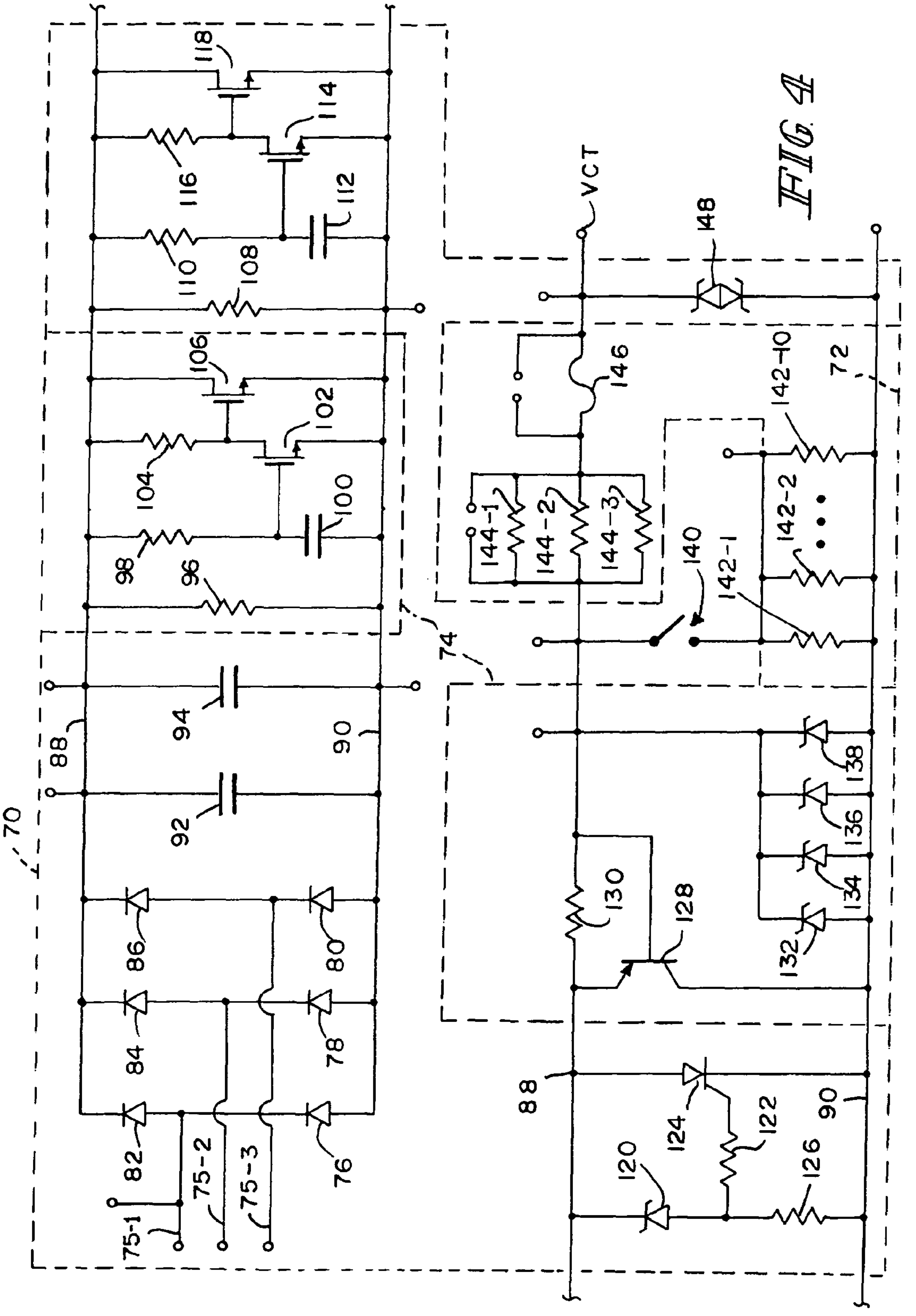
FIG. 4 illustrates a schematic diagram of compressed air-powered low magnitude voltage generator control circuitry useful in the described spray gun.

A turbine wheel 40 is mounted on the shaft 42 of generator 38. Compressed air coupled through a grounded air hose assembly 44 coupled to fitting 34 is channeled through assembly 32 and is directed onto the blades of wheel 40 to spin shaft 42 producing three phase voltage at terminals 75-1, 75-2, 75-3 (FIG. 4). The output from generator 38 is rectified and regulated in power module assembly 32, and the rectified and regulated output from power module assembly 32 is coupled through conductors in handle assembly 22 to a cascade assembly 50 extending from the top front of handle assembly 22 into barrel assembly 28.

Prior art cordless guns incorporate generators that use sintered metal bushing to guide the shaft ends of the generator. Thus, prior art cordless guns do not provide precision guidance of the generator shaft. This can result in the transmission of higher vibration levels from the generator to the body of the operator. The present gun 20's generator 38 uses ball or roller bearings. A precision ball or roller bearing guided generator 38 reduces the transmitted vibration to the mounting points and thus to the operator, potentially reducing operator fatigue. However, the bearings of commercially available fractional horsepower motors, such as generator 38, are susceptible to solvent penetration, degrading bearing lubrication, with the potential for bearing failure and generator 38 failure. Testing of the above-identified motor used as generator 38 demonstrated that a one minute soak in solvent fairly quickly degrades the bearing lubricant and causes the bearing to seize. To overcome this potential failure mode, upper and lower protective covers 51, 53, respectively, were secured to the generator 38 housing, reducing the likelihood of solvent penetration into the bearings. The same one minute solvent soak tests were performed on the thus-protected generator 38. These tests resulted in no detectable degradation of performance, even after several one minute solvent soak tests.

Referring now more particularly to FIGS. 2*a-e*, cascade assembly 50 includes a potting shell 52 in which cascade assembly 50 is potted, an oscillator assembly 54 on a printed circuit (PC) board, a transformer assembly 56, a voltage multiplier cascade 58 and a series output resistor string 60 providing 160 MΩ resistance coupling cascade 58 output to a charging electrode 62 at the nozzle 30 end of a valve needle 64.

Referring now particularly to FIGS. 3*a-c* and 4, the generator 38 control circuitry is mounted on three interconnected PC boards 70, 72, 74 which form somewhat of an inverted "U" configuration useful for cooling circuit components and efficient utilization of the available space inside power module assembly 32. A circuit diagram of the circuit spread over the three PC boards 70, 72, 74 is illustrated in FIG. 4 with broken lines around the components provided on each PC board 70, 72, 74. The three phase windings of generator 38, terminals 75-1, 75-2, 75-3, are coupled to the junctions of the cathodes of respective diodes 76, 78, 80 and anodes of respective diodes 82, 84, 86. Diodes 76, 78, 80, 82, 84, 86 illustratively are ON Semiconductor type MBR140SFT Schottky diodes. The thus-rectified three-phase potential across conductors 88, 90 is filtered by the parallel circuit including 47 μF capacitors 92, 94 and 15 KΩ, 0.1 W, 1% resistor 96. A series 100 KΩ, 0.1 W, 1% resistor 98—1 μF, 10%, 35 V capacitor 100 combination is also coupled across conductors 88, 90. Conductor 90 is coupled to ground.

The gate of an FET 102, illustratively a Fairchild Semiconductor 2N7002 FET, is coupled to the junction of resistor 98 and capacitor 100. The source of FET 102 is coupled to conductor 90. Its drain is coupled through a 10 KΩ, 0.1 W, 1% resistor 104 to conductor 88. The drain of FET 102 is also coupled to the gate of an FET 106, illustratively an International Rectifier IRLU3410 FET. The drain and source of FET 106 are coupled to conductors 88, 90, respectively. A 15 KΩ, 0.1 W, 1% resistor 108 is coupled across conductors 88, 90. A series 100 KΩ, 0.1 W, 1% resistor 110—1 μF, 10%, 35 V capacitor 112 combination is coupled across conductors 88, 90. The gate of an FET 114, illustratively a Fairchild Semiconductor 2N7002 FET, is coupled to the junction of resistor 110 and capacitor 112. The source of FET 114 is coupled to conductor 90. Its drain is coupled through a 10 KΩ, 0.1 W, 1% resistor 116 to conductor 88. The drain of FET 114 is also coupled to the gate of an FET 118, illustratively an International Rectifier IRLU3410 FET. The drain and source of FET 118 are coupled to conductors 88, 90, respectively.

The cathode of a Zener diode 120 is coupled to conductor 88. Diode 120 illustratively is a 17 V, 0.5 W Zener diode. The anode of diode 120 is coupled through a 1 KΩ, 0.1 W, 1% resistor 122 to the gate of an SCR 124 and through a 2 KΩ, 0.1 W, 1% resistor 126 to conductor 90. The anode of SCR 124 is coupled to conductor 88. Its cathode is coupled to conductor 90. SCR 124 illustratively is an ON Semiconductor type MCR100-3 SCR. The emitter of a bipolar PNP transistor 128 is coupled to conductor 88. Its collector is coupled to conductor 90. Its base is coupled through a 1.1Ω, 1 W, 1% resistor 130 to conductor 88. Transistor 128 illustratively is an ON Semiconductor type MJD32C transistor. Its base is also coupled to the cathodes of four parallel Zener diodes 132, 134, 136, 138, the anodes of which are coupled to conductor 90. Diodes 132, 134, 136, 138 illustratively are 15 V, 5 W ON Semiconductor type 1N5352B Zener diodes.

The base of transistor 128 is also coupled to one terminal of a switch 140, illustratively a Hamlin type MITI-3V1 reed switch. The other terminal of switch 140 is coupled to one terminal of a network of ten parallel 324Ω, 1 W, 1% resistors 142-1, 142-2, . . . 142-10. The other terminals of resistors 142-1, 142-2, . . . 142-10 are coupled to conductor 90. The base of transistor 128 is also coupled through a parallel network of three 1Ω, 1 W, 1% resistors 144-1, 144-2, 144-3 and a series 1.5 A, 24 V fuse 146 to the VCenterTap terminal of transformer assembly 56. See FIG. 5. The maximum voltage (hereinafter sometimes VCT) across the VCT terminal and conductor 90 is regulated by a bidirectional Zener diode 148 which illustratively is a Littelfuse SMBJ15CA 15 V diode.

Referring to the schematic in FIG. 4, typical rms voltage from each of the three input phases 75-1, 75-2, 75-3 to ground is approximately 7.5 V rms at a frequency of about 300 Hz. Diodes 76, 78, 80, 82, 84 and 86 form a three-phase full-wave bridge rectifier to convert the three phase AC output of the generator 38 to DC. Filter capacitors 92 and 94 smooth the ripple of the rectified output. The typical voltage across conductors 88, 90 is about 15.5 VDC.

The circuit of FIG. 4 includes two individual delay circuits connected in parallel. If a fault disables one of the delay circuits, the other is still operable. The first delay circuit includes resistors 96, 98, 104, capacitor 100 and FETs 102, 106. The second delay circuit includes resistors 108, 110, 116, capacitor 112 and FETs 114, 118. As discussed above, the generator 38 and the circuit of FIG. 4 are located in the spray gun 20 itself. Since the spray gun 20 can spray flammable liquid materials, its operating environment is considered hazardous by numerous industrial standards, such as FM, EN, and so on. The generator 38 and circuit of FIG. 4 must meet the requirements of such industrial standards for electrical equipment used in explosive atmospheres. Among the methods for meeting these requirements is to locate the generator 38 and the circuit of FIG. 4 inside an enclosure that is pressurized, before hazardous electrical potentials are reached. The standards require that five enclosure volumes be purged before hazardous potentials are reached. The illustrative generator 38 (Maxon EC-max part number 348702) does not generate hazardous voltage for air flows below 90 SLPM, since the air flow is insufficient to overcome the generator 38 inertia and spin the generator 38 at sufficient speed to do so. The enclosure volume for the generator 38 and circuit of FIG. 4 is 40 mL. Converting 90 standard liters per minute to mL per second gives:

90 L/min×1 min/60 sec×1000 mL/L=1500 mL/sec

The time required to purge 200 mL (5 purges times 40 mL/purge) at an air flow rate of 90 SLPM is therefore:

200 mL/(1500 mL/sec)=133 ms.

For higher air flows, the purge times will be shorter. Thus, to completely purge the enclosure, before hazardous voltages are reached, the purge time must be 133 ms or greater.

Since the purge air and the generator 38 turbine 40 air are the same, if the generator air is delayed, the purge air is also delayed. Therefore, delaying the start of the generator 38 until the enclosure volume is purged was not an option. While it is possible to use separate air sources for purge air and turbine 40 air, this was thought to result in a more complex, expensive to build and operate, and heavier gun 20.

Since the start of the generator cannot be delayed, the gun 20 circuitry shorts the output of the power supply of FIG. 4 until the desired five enclosure volumes are purged. Testing using EN standard 60079-11:2007 Explosive Atmospheres—Electrical Protection by Intrinsic Safety "i", establishes that the shorted output of the power supply of FIG. 4 is insufficient to ignite the most hazardous mixture for group IIB gases. So, if the output can be shorted for at least 133 ms, hazardous potentials will not be present until after the 5 enclosure volumes are purged. The two individual delay circuits connected in parallel achieve this objective.

Referring to FIG. 4, initially the voltage across capacitors 92, 94 is zero volts. Zero volts also appears across the gates of transistors 102, 114 to conductor 90, so initially, transistors 102, 114 are off (open circuit). As the generator 38 begins to spin, the voltage across conductors 88, 90 begins to rise. Because transistors 102, 114 are off, the voltage across conductors 88, 90 also appears on the gates of transistors 106, 118 to conductor 90. Once this voltage reaches the gate threshold voltage (about 2.5 volts for each of transistors 106, 118) transistors 106, 118 turn on and clamp the voltage across conductors 88, 90 at this level (about 2.5 volts). Meanwhile, the voltage across capacitors 100, 112 rises as charge flows through the series combinations 98, 100 and 110, 112. When the voltage across capacitors 100, 112 reaches the gate threshold voltage of transistors 102, 114, transistors 102, 114 turn on. The gate voltages of transistors 106, 118 drop below their threshold voltages and transistors 106, 118 turn off. This permits the voltage across conductors 88, 90 to rise to its normal operating level, about 15.5 VDC. The RC time constant values of the series combinations 98, 100 and 110, 112 are selected so that transistors 106, 118 remain on for at least 133 ms, but not much longer, so that the delay in getting to normal operating potential is short.

Resistors 96 and 108 bleed the charge from capacitors 100 and 112 when the trigger 26 is released, so that the delay circuit is ready to operate again when the gun 20 is next triggered. Resistors 96 and 108 are sized so that it takes a few (typically 2-5) seconds to discharge capacitors 100 and 112 so there is basically no delay for the relatively short (2-5 seconds) triggering interruptions encountered during typical spray applications. For longer triggering interruptions, capacitors 100 and 112 discharge and the delay circuits 96, 98, 104, 100, 102, 106; 108, 110, 116, 112, 114, 118 reset prior to the next trigger. The sizing of resistors 96 and 108 is a tradeoff between reducing the delay between triggerings and ensuring that when the trigger 26 is released long enough for a potentially hazardous atmosphere to collect in the enclosure volume, the delay circuits 96, 98, 104, 100, 102, 106; 108, 110, 116, 112, 114, 118 function as described above the next time the trigger 26 is pulled.

The circuit of FIG. 4 includes an over-voltage protection circuit comprising Zener diode 120, resistors 122 and 126, and SCR 124. Zener diode 120 is a 17 volt Zener diode. The normal maximum operating voltage across conductors 88, 90 is about 15.5 VDC. If voltage across conductors 88, 90 were to rise, it could result in an unsafe voltage across electrode 62 and ground. If this voltage rises to about 17 VDC, Zener diode 120 will begin to conduct resulting in current flow through resistor 126. The current flowing through resistor 126 results in a voltage at the resistor 122, resistor 126, Zener diode 120 node. This voltage creates a current flow in resistor 122 which turns SCR 124 on. Firing of SCR 124 effectively shorts conductors 88, 90, dropping the voltage across conductors 88, 90 from about 17 VDC to on the order of a couple of volts. The generator is loaded down by the short circuit. Releasing of the trigger 26 stops the generator 38, which removes voltage across conductors 88, 90, resetting SCR 124. No action is required by the user to reset from this condition.

The circuit of FIG. 4 includes a current limit circuit including power transistor 128 and resistor 130. A characteristic of an air turbine 40 driven electrical generator 38 is that as air flow to the turbine 40 increases, so does generator 38's power output. Without a current limit circuit, this increase in power output can cause the magnitude of the output voltage of the spray gun 20 to go too high. The increased power output can also exceed the power ratings of circuit components coupled to the generator 38. The current limit circuit including power transistor 128 and resistor 130 addresses these concerns. As the current through resistor 130 increases so does the voltage drop across it according to Ohm's law. If this voltage drop reaches the base-emitter turnon voltage (usually about 0.7 V) of transistor 128, transistor 128 begins to shunt current flow to ground, keeping current flow through resistor 130 relatively constant. In this circuit, resistor 130 is sized so that transistor 128 turns on when the current flow through resistor 130 is roughly 0.5 A. Thus the maximum current flow at VCT is about 0.5 A. As air flow increases, the current through transistor 128 increases. This can result in some significant heat dissipation in transistor 128. To alleviate this, transistor 128 is provided with a heat sink. The U-shaped circuit board 70, 72, 74 containing transistor 128 is installed over generator 38, attaching by three screws threaded into the top of the generator 38 housing. Thus the circuit board 70, 72, 74 is located in the same enclosure as the generator 38 This enclosure is small to decrease bulkiness and weight of the spray gun 20 and to keep the required purge volume small. With the three-piece, U-shaped circuit board 70, 72, 74, the board 70, 72, 74 can be located in the chamber with the turbine 40-driven generator 38. The plentiful exhaust air from the generator 38 is directed over the board 70, 72, 74 components, including transistor 128 and its heat sink to help cool them. The circuit board 70, 72, 74 and generator 38 must both meet the requirements for electrical equipment for use in explosive atmospheres. Thus, it is an advantage to put them both in the same enclosure so that the purge approach previously described will satisfy the requirements for both.

The circuit of FIG. 4 includes a voltage regulation circuit comprising Zener diodes 132, 134, 136 and 138. Without Zener diodes 132, 134, 136 and 138, as the load current at VCT decreases, the load on the generator 38 would decrease. The generator 38 speed would increase, resulting in an increase in the voltage across VCT and conductor 90. For light loads, the increase in speed and voltage can be significant, to the extent that the generator 38 could exceed its rated speed, in this case 300 Hz, and the voltage across VCT and conductor 90 could result in unsafe operation of the spray gun 20. The voltage regulation circuit 132, 134, 136, 138 addresses these issues. As the load current at VCT decreases, the speed of generator 38 increases and the voltage at the base of transistor 128 increases until (in this case, at about 15 volts DC) Zener diodes 132, 134, 136, 138 begin to conduct. Thus, for light loads the voltage at the base of transistor 128 is limited to about 15 volts in this case. This aids safe operation of the spray gun 20. When the Zener diodes 132, 134, 136, 138 conduct current from generator 38, they create additional load on generator 38. The Zener diodes 132, 134, 136, 138 are sized (15 volts in this case) to keep generator 38 (rated at 300 Hz in this case) from excessive speed when there is little or no current draw at VCT.

Turbine 40 produces torque based on the flow of air to turbine 40. As the flow of air to turbine 40 increases or decreases, so does the current output of the generator 38. With the Zener diodes 132, 134, 136, 138, a current of about 0.5 A is always flowing through resistor 130. Whatever does not flow through VCT flows through Zener diodes 132, 134, 136, 138. As the load current through VCT increases, the current through Zener diodes 132, 134, 136, 138 decreases. Eventually, at some operating condition, the current flow through Zener diodes 132, 134, 136, 138 drops to zero, the voltage across the Zener diodes drops below 15 volts and the Zener diodes stop conducting. This happens when the load requires all the current that the generator 38 is delivering at its present input torque.

Multiple (n) Zener diodes 132, 134, 136, 138 (in this case n=4) are used to spread the power dissipation over multiple devices 132, 134, 136, 138 so that any one device 132, 134, 136, 138 need only be able to dissipate roughly 1/n of the power it would dissipate if it were in the circuit by itself. Additionally, some safety standards require duplication of safety circuits, such that if one device fails the other(s) continue(s) to provide the protection for which the devices are included in the circuit.

For the lightest loads, the Zener diodes 132, 134, 136, 138 can dissipate significant power. Thus, they are also mounted on the circuit board 70, 72, 74 and cooled using the exhaust air from the air turbine 40 which flows over the Zener diodes 132, 134, 136, 138 and the other circuit components.

The circuit of FIG. 4 includes a low KV set point circuit including reed switch 140 and resistors 142-1, . . . 142-10. Resistors 142-1, . . . 142-10 are sized (in this case 324Ω apiece) such that their parallel combination (in this case 32.4Ω) presents a load to the generator 38 that, when switched in by the reed switch 140, causes the generator 38 speed and therefore the voltage across VCT to conductor 90 to drop, producing a lower output voltage at electrode 62 of the spray gun 20. This is convenient when the operator is coating articles that exhibit Faraday cages, where lower output voltage at the spray gun 20 will assist in providing better coverage into such shielded areas. Also, some operators desire to operate such guns' output electrodes at lower output high magnitude voltages during normal spraying to reduce paint wrapback of charged coating material particles in the direction of the operator, and for other reasons as determined by the operator. Typically, the lower set point is chosen to be between 50% and 75% of the full output available when the reed switch 140 is open, but can be other values as well.

The reed switch 140 is located near the edge of the board assembly 70, 72, 74 so that reed switch 140 can be activated by a control knob 141 for moving a magnet provided in a head 143 of knob 141 on the outside of the enclosure. When knob

141 is pivoted to position the magnet near reed switch 140, reed switch 140 closes, connecting the parallel combination of resistors 142-1, . . . 142-10 in circuit, thereby producing the lower KV set point at the spray gun 20 output 62. When knob 141 is pivoted to position the magnet away from reed switch 140, reed switch 140 opens, taking the parallel combination of resistors 142-1, . . . 142-10 out of circuit, thereby producing the high KV set point at the spray gun 20 output 62.

When the low KV set point is selected, some power, on the order of a few watts, will be dissipated in resistors 142-1, . . . 142-10. As noted above, a single, multiple watt resistor is typically large and bulky. In order to keep the size of the overall package down, ten, 1 watt, (324Ω) surface mount resistors 142-1, . . . 142-10 in parallel are used in place of one, 10 watt (32.4Ω) resistor. The overall profile of the assembly is kept small, resulting in a smaller package and a smaller enclosure. The power dissipation in all resistors 142-1, . . . 142-10 is limited to 50% of their rated value. Thus, if the maximum power dissipation of a resistor was expected to be 0.5 watts, a 1 watt resistor was used.

Since resistors 142-1, . . . 142-10 collectively dissipate on the order of watts of power, they are also mounted on circuit boards 70, 72, 74 and cooled using the exhaust air from the air turbine 40 which flows over resistors 142-1, . . . 142-10 and the other circuit components mounted on boards 70, 72, 74.

The circuit of FIG. 4 includes a voltage dropping resistor parallel combination of resistors 144-1, 144-2 and 144-3. Supplying the most voltage to VCT results in higher transfer efficiency of coating material to the article that is being coated. However, the gun 20 must also meet safety requirements as determined by approval agencies such as Factory Mutual and European standards such as EN 50050. These requirements typically entail that the spray gun 20 output at 62 not be capable of igniting the most explosive mixture of a specified explosive atmosphere (in this case 5.25% propane in air). Resistors 144-1, . . . 144-3 are provided to enable the output at the spray gun 20 to be dropped if necessary, to meet the requirements.

When resistors 144-1, . . . 144-3 are in the circuit, the voltage at VCT is dropped by the product of the current flowing through the parallel combination of R20, R21 and R22 and the resistance of the parallel combination of resistors 144-1, . . . 144-3 in accordance with Ohm's law. Thus, the voltage at VCT is given by:

$$VCT=V_{base\ of\ 128}-I_{R144\text{-}1,R144\text{-}2,R144\text{-}3}\times R144\text{-}1\|R144\text{-}2\|R144\text{-}3$$

It can be seen that as the load current ($I_{R144\text{-}1,R144\text{-}2,R144\text{-}3}$) increases, so does the voltage drop across the parallel combination R144-1||R144-2||R144-3. Most guns are classified by their no load KV. So at no load, there will be minimal effect on the spray gun output voltage, but as the load increases, the voltage will decrease more. Thus, the KV rating of the spray gun can remain essentially the same. If in a particular application resistors 144-1, . . . 144-3 are not necessary to meet safety requirements, they can simply be left off the board 70, 72, 74 assembly and a jumper inserted so that the voltage at VCT is the same as that at the base of transistor 128. It should further be noted that if additional means are necessary to meet safety requirements, the current limit resistance of resistor 130 can be increased on the order of tenths of ohms to reduce the available output current of the spray gun 20.

Resistors 144-1, . . . 144-3 are one watt surface mount resistors, taking the place of a single three watt resistor, resulting in a smaller overall enclosure. They are also mounted on circuit boards 70, 72, 74 and cooled using the exhaust air from the air turbine 40.

The circuit of FIG. 4 includes a polythermal fuse 146. This fuse is designed to open if its trip current (in this case 1.5 A) is exceeded and reset itself when power is turned off. The hold current of fuse 146 is 0.75 A, which allows for uninterrupted flow of the maximum expected current of about 0.5 A, even for elevated temperatures where poly-thermal devices are subject to tripping for smaller current levels.

The circuit of FIG. 4 includes a transient suppressor diode 148. Transient suppressor diode 148 is coupled across VCT and conductor 90 and is sized to shunt to ground any voltage spikes more than a volt or two above the nominal 15.5 VDC output. The main purpose of diode 148 is to shunt to ground any transients from the FIG. 5 circuitry coupled to VCT to keep such transients from adversely affecting any of the circuitry of FIG. 4.

Figure 3A:
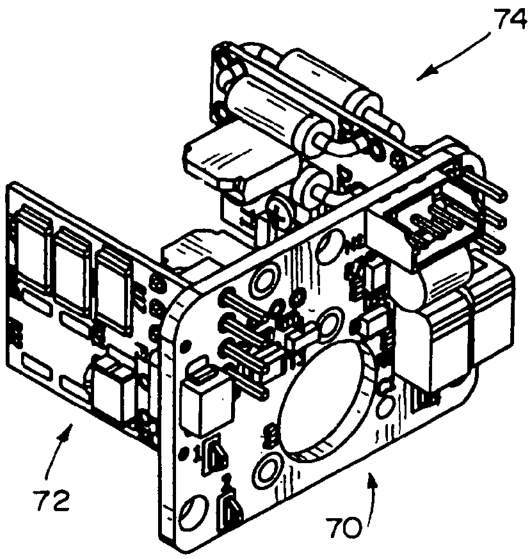
FIGS. 3*a-c* illustrate perspective views, FIGS. 3*a-b*, and an elevational view, FIG. 3*c*, of a printed circuit (PC) board assembly containing control circuitry useful in the described spray gun.
Figure 3B:
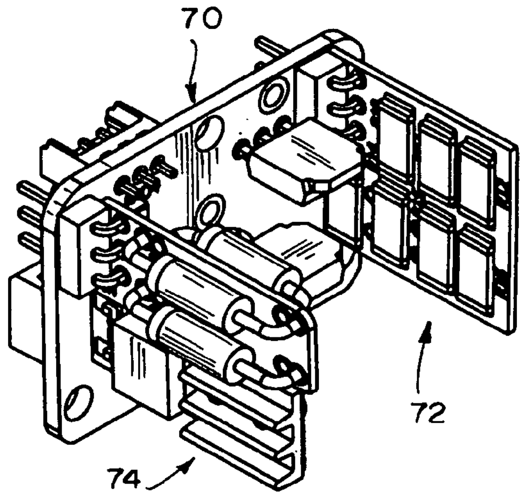
Figure 3C:
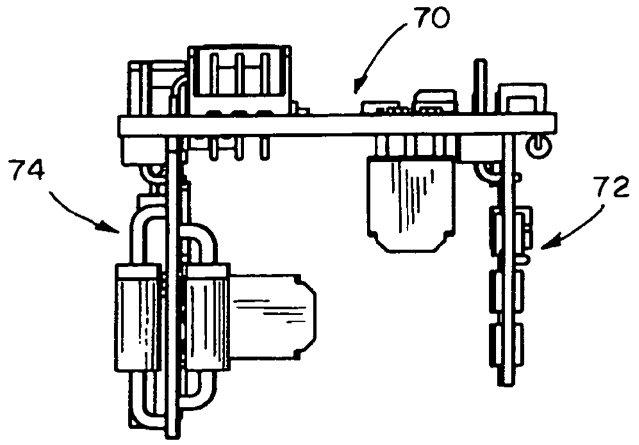

The U-shaped board assembly 70, 72, 74 is best illustrated in FIGS. 3*a-c*. This assembly includes three PC boards 70, 72, 74 that are joined together to create the final U-shaped board assembly. Arranging the board assembly in this manner, and utilizing small through-hole and surface mount components permits the generator 38/turbine 40 to be mounted in the U of the board assembly 70, 72, 74 and permits the overall profile of the board assembly 70, 72, 74 to be kept close to the overall profile of the generator 38/turbine 40 as shown in FIG. 4. This results in a smaller, lighter enclosure volume that requires less time to be purged.

To protect the board 70, 72, 74 components from contaminants which may be introduced from the input air driving the turbine 40, the board may be conformally coated using any of the known available techniques, such as spraying, dipping or vacuum deposition, for example, with parylene. However, attention must be paid to suitable cooling of heat dissipating components, when a conformal coating is used.

The illustrative generator 38 is a three-phase, brushless DC motor operated in reverse. A brushless motor eliminates brush wear that results in shorter motor life. A two-phase motor can be used as well, but the output ripple from a two-phase motor will be greater, perhaps requiring larger filter capacitors 92, 94. Also, a two-phase motor may be required to spin faster to generate the same output power, which may result in shorter motor life. The air turbine 40 exhaust air is also directed over and around the generator 38 to cool it during operation. This also results in longer motor life.

Figure 5:
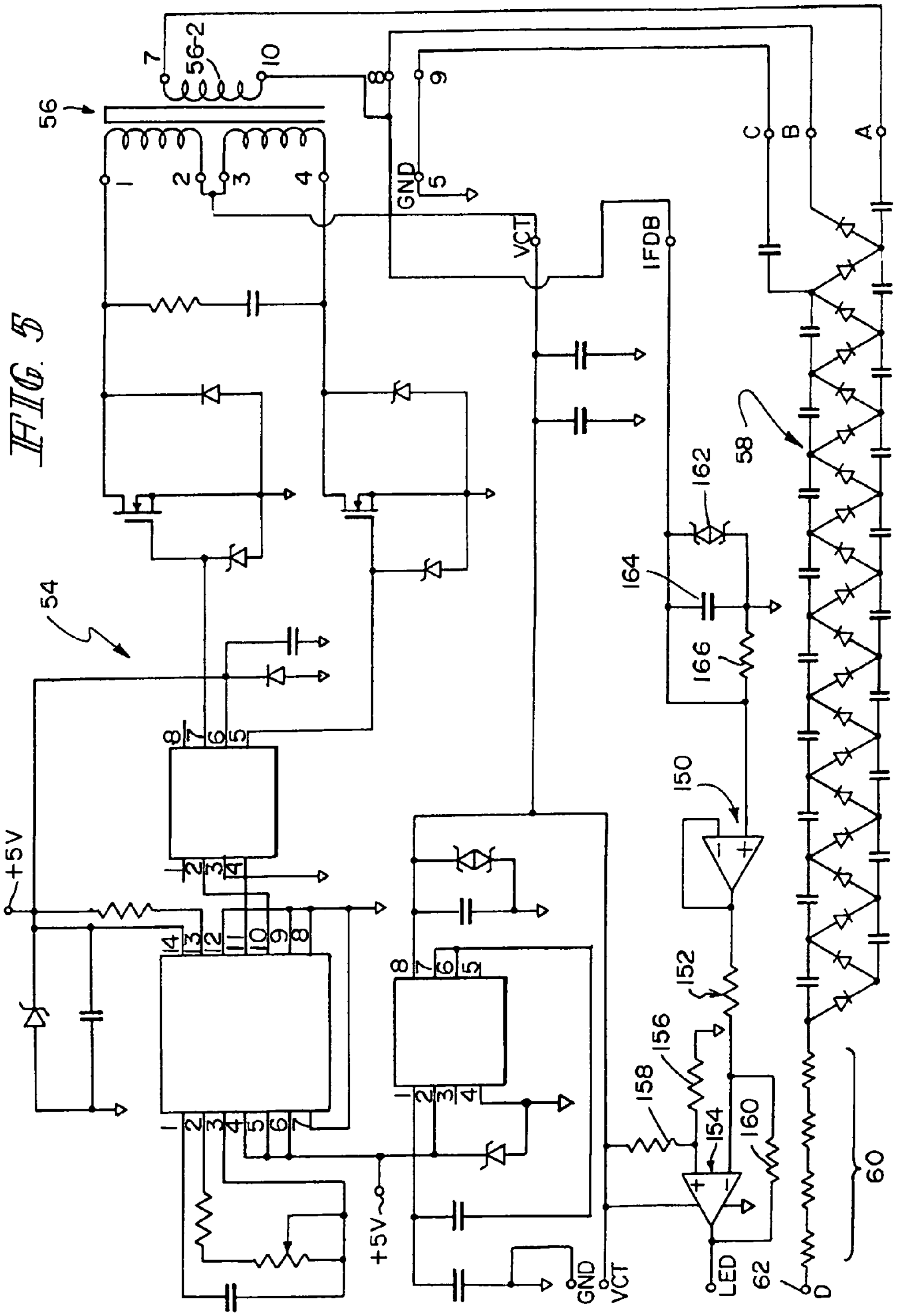
FIG. 5 illustrates a schematic diagram of a high-magnitude voltage cascade assembly useful in the described spray gun.

Referring now particularly to FIG. 5, the cascade assembly 50 including oscillator assembly 54, a transformer assembly 56, cascade 58 and series output resistor string 60 may be substantially as illustrated and described in U.S. published patent application 2006/0283386 A1, and so will not be described in any greater detail here. Feedback from the secondary winding 56-2 of the high voltage transformer of transformer assembly 56 is coupled to a non-inverting (+) input terminal of a differential amplifier 150 configured as a unity gain buffer. The joined inverting (−) and output terminals of amplifier 150 are coupled through a 49.9 KΩ resistor 152 to the − input terminal of a differential amplifier 154. Amplifiers 150, 154 illustratively are an ON Semiconductor type LM358DMR2 dual operational amplifier.

The + input terminal of amplifier 154 is coupled through a 49.9 KΩ resistor 156 to ground and through a 49.9 KΩ resistor 158 to the VCT supply. The − input terminal of amplifier 154 is coupled through a 49.9 KΩ resistor 160 to the output terminal of amplifier 154, which is coupled (FIG. 6) through a parallel combination of two 2.05 KΩ resistors 161-1, 161-2 to the anode of a red LED 163. The cathode of LED 163 is coupled to ground. When actuated, LED 163 is visible to an operator of gun 20 through a lens in a rear cover assembly 165 (FIG. 1) at the top of the handle assembly 22. The + input terminal of amplifier 150 is coupled through the parallel combination of a varistor 162, a 0.47 μF capacitor 164 and a 49.9 KΩ resistor 166 to ground. Varistor 162 illustratively is a Littelfuse SMBJ15A 15 V device.

Electrons discharged from electrode 62 flow across the gun-to-target space, charging the coating material particles intended to coat the target. At the target, which is typically maintained as close as possible to ground potential for this purpose, the charged coating material particles impinge upon the target and the electrons from the charged coating material particles return through ground and the parallel combination of components 162, 164, 166 to the "high" or + (that is, near ground potential) side of the high potential transformer secondary 56-2. Thus, a voltage drop proportional to the output current of the cascade 58 is produced across resistor 166. Capacitor 164 filters this voltage, providing a less noisy DC level at the + input terminal of op amp 150. Varistor 162 reduces the likelihood of damage to op amp 150 and other circuit components by transients attributable to the operation of the cascade 58. Op amp 150 is configured as a voltage follower to isolate the voltage at its + input terminal from the voltage at its output terminal. This helps to insure that all of the current returning to the "high" or + side of the high potential transformer secondary 56-2 flows through resistor 166.

The voltage across resistor 166 is given by:

$$V_{R166}=I_{OUT}\times R_{166}$$

where $I_{OUT}$ equals the current flowing from electrode 62 and $R_{166}$ is the resistance of resistor 166. Because op amp 150 is configured as a voltage follower, $V_{R166}$ appears at the output terminal of op amp 150 and at the − input terminal of op amp 150. Resistor 166 is sized so that the voltage at the + input terminal of op amp 150 is 5 volts per 100 microamps of current flowing through resistor 166. The combination of resistors 152, 160, 156 and 158 and op amp 154 form a difference amplifier that results in a voltage at the output terminal of op amp 154 of:

$$V_{LED}=VCT-V_{OUT150}$$

VCT is the regulated DC voltage output of the power supply circuit of FIG. 4 which is supplied to the center tap of the primary winding 56-1 of transformer 56. The oscillator 54 output transistors alternately switch respective halves of the primary 56-1 of transformer 56 to ground at a frequency on the order of several tens of kilohertz. The output of secondary 56-2 is rectified and multiplied by cascade 58. Spray gun 20 must meet safety requirements of various approval agencies such as Factory Mutual, and EN standards such as EN 50050. These requirements typically entail that the spray gun 20 output at electrode 62 not be capable of igniting the most explosive mixture of a specified explosive atmosphere (in this case 5.25% propane in air). To help achieve this, the power supply circuit is typically arranged so that VCT decreases with increasing load current from electrode 62 of the spray gun 20.

Since, $$V_{OUT150}=V_{R166}=I_{OUT}\times R_{166}$$

then, $$V_{LED}=VCT-I_{OUT}\times R_{166}$$

For light loads, the magnitude of the output voltage at electrode 62 is high, $I_{OUT}$ is small, and VCT is on the order of 15 to 15.5 volts. Thus, for light loads $V_{LED}$ is on the order of 12 to 15 volts. As the load increases, the magnitude of the output voltage at electrode 62 decreases, and $V_{LED}$ decreases, at least because heavier loads load down the input circuit supplying VCT, resulting in a decrease of VCT, and, because for heavier loads $I_{OUT}$ increases. Eventually, for heavy loads where magnitude of the output voltage at electrode 62 is low, $I_{OUT}\times R_{166}$ exceeds VCT. When this occurs, $V_{LED}$ goes to zero. Thus, the circuit is designed such that:

for light loads, when the magnitude of the output voltage at electrode 62 is high, $V_{LED}$ is on the order of 12 to 15 VDC;

for medium loads, when the magnitude of the output voltage at electrode 62 is in its midrange, $V_{LED}$ is on the order of 5 to 12 VDC; and, for heavy loads, when the magnitude of the output voltage at electrode 62 is low, $V_{LED}$ is on the order of 0 to 5 VDC.

Figure 6:
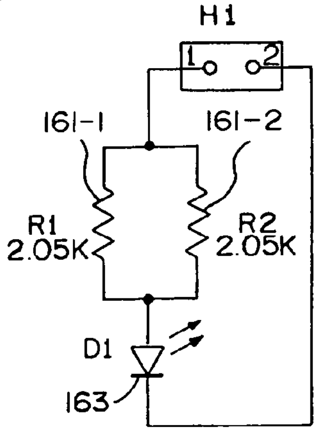
FIG. 6 illustrates a schematic diagram of a light emitting diode (LED) circuit useful in the described spray gun.

$V_{LED}$, the output terminal of op amp 154, is coupled to pin H1-1 of the circuit illustrated in FIG. 6. Pin H1-2 of the circuit illustrated in FIG. 6 is coupled to ground. Thus, for light loads, LED 163 of FIG. 6 burns brightly. LED 163 dims somewhat for medium loads, and dims significantly or turns off completely for heavy loads. Thus, the intensity of illumination of LED 163 reflects the actual voltage at terminal 62 of spray gun 20. Additionally, for those failure modes resulting in excessive output current from cascade 58, LED 163 will dim significantly or be completely off, thereby alerting the user to the situation so corrective action can be taken. This is especially important to the operator of gun 20 when spraying conductive coating materials that may short the output of the spray gun 20 resulting in little or no output voltage at terminal 62. Gun designs with display devices operating from the input circuit of the cascade could exhibit little or no variation in brightness.

Air is supplied to the spray gun 20 through grounded air hose assembly 44, from a source 172 of clean, dry air. The air is supplied up the handle 24 to the trigger valve 174. Pulling of the trigger 26 opens the trigger valve 174 permitting air to flow out the front of the gun 20 to atomize the coating material being sprayed. Opening the trigger valve 174 also permits air to flow back down the handle 24 through an air delivery tube 175 in handle assembly 22 to the generator 38. The input air to the generator 38 is supplied through an air inlet to a cap 176. The cap 176 surrounds turbine wheel 40 mounted on generator 38 shaft 42 and is sealed with an O-ring such that the only direction of air flow is through four openings in the cap 176 spaced 90° apart, that direct the air onto wheel 40. The air flow causes wheel 40 and the generator shaft 42 on which it is mounted to spin. After flowing through wheel 40, the air flows around the interconnected PC boards 70, 72, 74, providing cooling air to generator 38, boards 70, 72, 74 and the components mounted on them. The air is then exhausted through fitting 182.

Spinning of the generator 38 shaft 42 causes the three phase generator 38 to generate electricity which is full-wave rectified by the circuitry on PC boards 70, 72, 74 before being supplied to the cascade assembly 50 via VCT. The maximum voltage across Zener diode 148 is 16 VDC due to the limiting action of the four Zener diodes 132, 134, 136, 138. When the spray gun trigger 26 is released, the trigger valve 174 closes, halting the flow of air to the generator 38 and to the nozzle 30.

What is claimed is:

1. A coating dispensing device including a trigger assembly for actuating the coating dispensing device to dispense coating material, and a nozzle through which the coating material is dispensed, a first port adapted to supply compressed gas to the coating dispensing device, a second port adapted to supply coating material to the coating dispensing device, a generator having a shaft, a turbine wheel mounted on the shaft, compressed gas coupled to the first port impinging upon the turbine wheel to spin the shaft, producing voltage, a regulator coupled to the generator for regulating the voltage generated by the generator, an electrode adjacent the nozzle and coupled to the regulator to receive electricity therefrom to electrostatically charge the coating material, and a circuit board assembly configured to partially surround and partially enclose the generator, the circuit board assembly comprising a central board having two opposed edge regions and a board extending from each of said two opposed edge regions of the central board, each of the central board and the boards extending from said two opposed edge regions mounting electrical components of the regulator.

2. The coating dispensing device of claim 1 wherein compressed gas which spins the turbine wheel also flows past the at least some components of the regulator provided on the board assembly to remove heat from the at least some components of the regulator provided on the board assembly.

3. The coating dispensing device of claim 2 wherein the at least some components of the regulator include an over-voltage protection circuit.

4. The coating dispensing device of claim 3 wherein the over-voltage protection circuit comprises a self-resetting over-voltage protection circuit.

5. The coating dispensing device of claim 2 wherein the at least some components of the regulator include a limiting circuit in the event of excessive compressed gas flow to the turbine wheel.

6. The coating dispensing device of claim 5 wherein compressed gas which spins the turbine wheel also flows past the limiting circuit, the limiting circuit including a heat-dissipating device which dissipates more heat when excessive compressed gas flows to the turbine wheel, so that excessive compressed gas flow to the turbine wheel provides increased cooling capacity to the heat-dissipating device.

7. The coating dispensing device of claim 2 wherein the at least some components of the regulator include a limiting circuit for when the generator experiences a light load.

8. The coating dispensing device of claim 7 wherein the limiting circuit is sized to keep the generator from excessive speed when the generator experiences a light load.

9. The coating dispensing device of claim 7 wherein the limiting circuit comprises n solid state devices, n>1, each solid state device capable of dissipating about 1/n of the total heat dissipated by the n solid state devices collectively.

10. The coating dispensing device of claim 2 wherein the at least some components of the regulator include an output voltage adjusting circuit adapted to load the generator, causing the generator's speed to drop, producing a lower generator output voltage.

11. The coating dispensing device of claim 10 wherein the output voltage adjusting circuit includes a magnetically actuated switch controlling current flow through the output voltage adjusting circuit, and a magnet movable to actuate the magnetically actuated switch selectively to place the output voltage adjusting circuit in the regulator circuit and remove the output voltage adjusting circuit from the regulator circuit.

12. The coating dispensing device of claim 11 wherein the output voltage adjusting circuit includes n resistors, n>1, each resistor capable of dissipating about 1/n of the total heat dissipated by the n resistors collectively.

13. The coating dispensing device of claim 2 wherein the regulator includes an output terminal and a self-resetting fuse in series with the output terminal.

14. The coating dispensing device of claim 2 wherein the regulator includes an output port and a transient suppressor diode across the output port to protect the output port against backward-propagating transients entering the regulator.

15. The coating dispensing device of claim 2 wherein the regulator includes an output terminal coupled to the electrode and the at least some components of the regulator include a resistance in series with the output terminal.

16. The coating dispensing device of claim 15 wherein the resistance in series with the output terminal includes n resistors, n>1, each resistor capable of dissipating about 1/n of the total heat dissipated by the n resistors collectively.

17. The coating dispensing device of claim 1 wherein the at least some components of the regulator include a limiting circuit in the event of excessive compressed gas flow to the turbine wheel.

18. The coating dispensing device of claim 17 wherein compressed gas which spins the turbine wheel also flows past the limiting circuit, the limiting circuit including a heat-dissipating device which dissipates more heat when excessive compressed gas flows to the turbine wheel, so that excessive compressed gas flow to the turbine wheel provides increased cooling capacity to the heat-dissipating device.

19. The coating dispensing device of claim 1 wherein the at least some components of the regulator include a limiting circuit for when the generator experiences a light load.

20. The coating dispensing device of claim 19 wherein the limiting circuit is sized to keep the generator from excessive speed when the generator experiences a light load.

21. The coating dispensing device of claim 19 wherein the limiting circuit comprises n solid state devices, n>1, each solid state device capable of dissipating about 1/n of the total heat dissipated by the n solid state devices collectively.

22. The coating dispensing device of claim 1 wherein the at least some components of the regulator include an output voltage adjusting circuit adapted to load the generator, causing the generator's speed to drop, producing a lower generator output voltage.

23. The coating dispensing device of claim 22 wherein the output voltage adjusting circuit includes a magnetically actuated switch controlling current flow through the output voltage adjusting circuit, and a magnet movable to actuate the magnetically actuated switch selectively to place the output voltage adjusting circuit in the regulator circuit and remove the output voltage adjusting circuit from the regulator circuit.

24. The coating dispensing device of claim 23 wherein the output voltage adjusting circuit includes n resistors, n>1, each resistor capable of dissipating about 1/n of the total heat dissipated by the n resistors collectively.

25. The coating dispensing device of claim 1 wherein the regulator includes an output terminal and a self-resetting fuse in series with the output terminal.

26. The coating dispensing device of claim 1 wherein the regulator includes an output port and a transient suppressor diode across the output port to protect the output port against backward-propagating transients entering the regulator.

27. The coating dispensing device of claim 1 wherein the regulator includes an output terminal coupled to the electrode and the at least some components of the regulator include a resistance in series with the output terminal.

28. The coating dispensing device of claim 27 wherein the resistance in series with the output terminal includes n resistors, n>1, each resistor capable of dissipating about 1/n of the total heat dissipated by the n resistors collectively.

* * * * *